US011973304B1

(12) United States Patent
Huang et al.

(10) Patent No.: US 11,973,304 B1
(45) Date of Patent: Apr. 30, 2024

(54) TUNABLE LASER

(71) Applicant: Acacia Communications, Inc., Maynard, MA (US)

(72) Inventors: Xue Huang, Holmdel, NJ (US); Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 385 days.

(21) Appl. No.: 17/017,532

(22) Filed: Sep. 10, 2020

Related U.S. Application Data

(60) Provisional application No. 62/898,108, filed on Sep. 10, 2019.

(51) Int. Cl.
*H01S 3/13* (2006.01)
*H01S 3/136* (2006.01)
*H01S 5/14* (2006.01)

(52) U.S. Cl.
CPC .......... *H01S 3/1307* (2013.01); *H01S 3/1305* (2013.01); *H01S 3/136* (2013.01); *H01S 5/14* (2013.01); *H01S 5/141* (2013.01)

(58) Field of Classification Search
CPC .......... H01S 5/14; H01S 5/141; H01S 3/1305; H01S 3/1307; H01S 3/136
See application file for complete search history.

(56) References Cited

U.S. PATENT DOCUMENTS

| | | | | |
|---|---|---|---|---|
| 2006/0198415 | A1* | 9/2006 | Yamazaki | G02F 1/0147 372/67 |
| 2008/0232409 | A1* | 9/2008 | Yamazaki | G02B 6/12004 372/20 |
| 2008/0259437 | A1* | 10/2008 | Suzuki | H01S 5/1032 359/326 |
| 2009/0285251 | A1* | 11/2009 | Yamazaki | H01S 5/141 372/29.014 |
| 2016/0156149 | A1* | 6/2016 | Takabayashi | H01S 5/142 372/6 |
| 2021/0376569 | A1* | 12/2021 | Tanaka | H01S 5/06256 |

* cited by examiner

*Primary Examiner* — Michael Carter
(74) *Attorney, Agent, or Firm* — K&L Gates LLP

(57) ABSTRACT

A method, apparatus, and system for adjusting the phase noise of a laser.

11 Claims, 7 Drawing Sheets

TUNABLE LASER

CROSS REFERENCE TO RELATED APPLICATION AND PRIORITY CLAIM

This application claims the benefit of U.S. Provisional Patent Application Ser. No. 62/898,108 filed Sep. 10, 2019 entitled "Tunable Laser," which is hereby incorporated herein by reference in its entirety for all purposes.

BACKGROUND

Optical transmission of information over a fiber optic cable often encodes the information on a light wave from a laser.

BRIEF DESCRIPTION OF THE FIGURES

Various aspects and embodiments of the application will be described with reference to the following example embodiments. It should be appreciated that the figures are not necessarily drawn to scale.

SUMMARY

Figure 1:
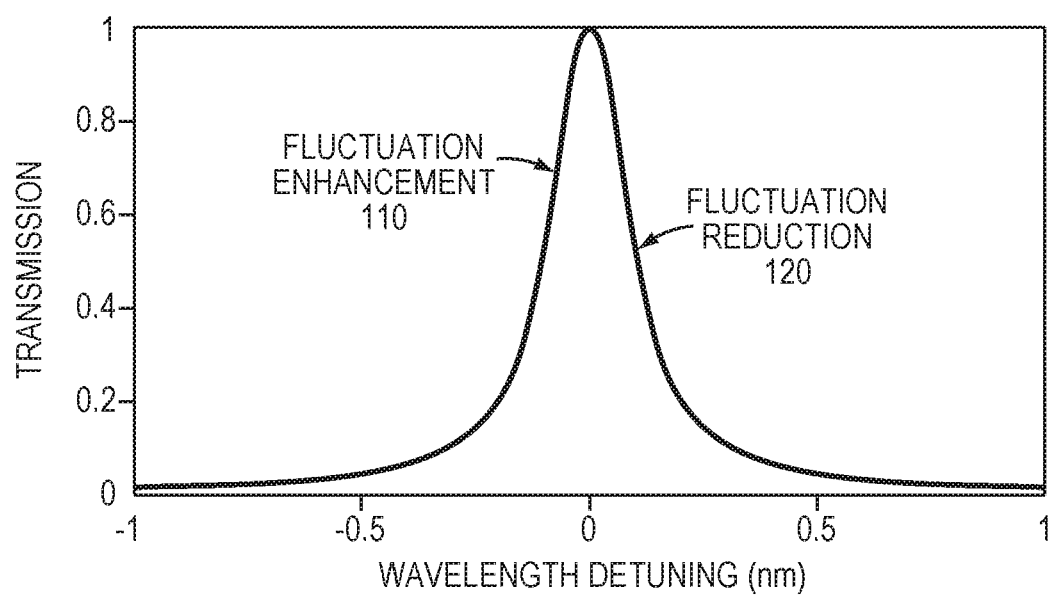
FIG. 1 is a simplified illustration of a transmission spectrum of a laser cavity filter used to select laser mode, in accordance with an embodiment of the present disclosure.

A method, apparatus, and system for adjusting the phase noise of a laser.

DETAILED DESCRIPTION

In many embodiments, an optical communication or transmission system may include a transmitter and a receiver. In most embodiments, a transmission, such as a set of digital bits, may be encoded in a signal at a transmitter. In certain embodiments, bits may be encoded in a wavelength of light.

In most embodiments, in a coherent optical communication system, a carrier may be an optical output (light) from a laser at the transmitter. In different embodiments, different lasers may be at different wavelengths of light. In almost all embodiments, a transmitter may have a laser producing a wavelength of light onto which data is encoded.

In many embodiments, it may be necessary to tune a tunable laser to a specific wavelength. In most embodiments, a laser may be able to output different wavelengths of light, and the wavelength of any outputted light may be influenced by temperature and distortion from different components of the laser and or environment. Conventionally, lasers are mounted on thermoelectric heaters/coolers and control electronics temperature tune the laser by changing electrical and environmental properties of components of the laser. Generally, some laser systems may use a thermo-optic phase shifter (TOPS) to help tune the laser. Usually, changing the temperature of a laser and or components of the laser via change in the applied electrical power may change the optical properties of the laser or components of the laser. In some embodiments there may be one or more ring resonators inside the laser cavity for wavelength selection. In many embodiments, tuning the laser may be accomplished by changing a resonant wavelength of the rings. In some embodiments, target electrical power applied to the TOPS may be calculated from formulas with parameters calibrated for resonant wavelength versus TOPS power. In some embodiments, target electrical power may be determined via calibration measuring multiple iterations' output to balance the tradeoff between linewidth and output optical power.

In most embodiments, Applicants have realized a tunable laser output has phase noise. In many embodiments, the amount of phase noise in a specified frequency range may be represented by linewidth. In some embodiments, laser linewidth may be one of the most critical parameters of tunable lasers used in a coherent communication system. Typically, laser linewidth may be a measure of phase noise in the laser. Usually, a measure of laser linewidth may be frequency dependence. Conventionally, the lasing frequency may move around more at lower frequencies and move around less at higher frequencies. Generally, when linewidth reaches a bottom or floor it may be mostly made up of quantum noise. In many embodiments, laser linewidth may be a measure of phase noise (jitter), which may be between 1 to 50 megahertz. In certain embodiments, laser linewidth may be a measure of how much jitter occurs at a given frequency.

Conventionally, laser tuning may be performed using wavelength-selective filters. Generally, wavelength-selective filters may be tuned using calibrated values. Conventionally a cavity laser may function by lasing at a transmission peak wavelength of the filters, to minimize the cavity noise. Commonly, to get ~100 kHz level low linewidth, an approach is to use a long cavity, e.g., of length 4 cm, as the linewidth is inversely proportional to the square of the cavity length. In many embodiments, the current disclosure has realized that increasing the length of the laser cavity to limit linewidth results in a device size that is large with a narrow cavity mode spacing, which puts a tunable laser at the risk of cavity mode hop. In other embodiments, Applicants have realized that a laser with ring resonators may not have a suitable feedback signal to preclude the mode hop. In further embodiments, Applicants have realized that it would be beneficial to be able to have a low linewidth without having a long cavity.

In most embodiments, Applicants have realized it may be beneficial to use one or more intra-cavity ring filters to tune a laser. In many embodiments, intra-cavity ring filters may be part of a laser. In some embodiments, an intra-cavity ring filter may be used like an add-drop filter. In most embodiments, an add-drop filter may be a filter that passes certain wavelengths of light through the filter, and directs other wavelengths of light to a separate waveguide. In certain embodiments, a certain wavelength threshold may be used to determine which wavelengths are passed through a drop-add filter and which wavelengths of light are sent to another waveguide. In some embodiments, light may travel from a first intra-cavity ring filter to another intra-cavity ring filter through a waveguide. In most embodiments, light that does not travel from a first intra-cavity ring filter to a waveguide may go to a photodiode. In almost all embodiments, light may build up in an intra-cavity ring filter. In some embodiments, if light is not of a correct frequency, it may not enter an intra-cavity ring filter. In most embodiments, if two on resonance intra-cavity ring filters are connected in the drop configuration, close to all of the light may be passed between the two intra-cavity ring filters. In many embodiments, if two intra-cavity ring filters share the same resonance, then light transmission between waveguides may be close to 100%. In certain embodiments, a monolithic laser may be integrate a gain chip. In many embodiments, an optical gain chip may be a device that provides optical gain for a laser. In some embodiments, an optical gain chip may receive an optical signal from an external cavity photonic integrated circuit (PIC). In certain embodiments, an optical gain chip may provide an optical output of the signal. In some embodiments, there may be other filters in a laser cavity.

In some embodiments, a laser may have a single intra-cavity ring filter. In other embodiments, a laser may have two intra-cavity ring filters. In further embodiments, a laser may have three intra-cavity ring filters. In still further embodiments, a laser may have more than three intra-cavity ring filters. In many embodiments, each intra-cavity ring filter may have light routed to a rejection photodiode. In most embodiments, each intra-cavity ring filter may have light routed to a monitor photodiode. In certain embodiments, each intra-cavity ring filter may have a feedback loop configured to control each respective intra-cavity ring filter.

In certain embodiments, each ring resonator may have two waveguides coupled to it. In some embodiments, light in a laser cavity may pass from one waveguide, through a ring, to another other waveguide. In those sum embodiments, such a configuration may act as a passband filter for the cavity. In certain embodiments, a photodetector may be optically connected to a portion of a waveguide that proceeds past a ring resonator. In these certain embodiments, a photodetector may be optically connected to a portion of a waveguide that proceeds past a ring resonator may be called a "rejection photodetector." In certain embodiments, when incoming light is perfectly on resonance with a ring resonator and waveguides have equal coupling to the ring resonator, a rejection photodetector signal may be zero. In many embodiments, changing the resonant wavelengths of the intra-cavity ring filters may tune a single mode wavelength of the laser. In most embodiments, a tunable laser with one or more intra-cavity ring filters may not have a large laser cavity. In almost all embodiments, Applicants have realized that a rejection photodetector may provide input to a feedback loop as a measure of a ring filter. In most embodiments, it may be possible to tune an intra-cavity ring filter using measurements from a rejection photodetector. In certain embodiments, feedback from a rejection photodetector may be used to change the setting of a TOPS. In some embodiments, resonant wavelength may be a parameter in formulas for calculation of TOPS power.

In many embodiments, an intra-cavity ring filter may have a TOPS co-located with the intra-cavity ring filter that may be used to change the optical properties of the intra-cavity ring filter. In some embodiments, if a tunable laser has multiple intra-cavity ring filters each ring filter may have a TOPS co-located with each respective intra-cavity ring filter. In many embodiments, a TOPS may be co-located with an intra-cavity ring filter to impact the temperature of the co-located intra-cavity ring filter without materially changing a temperature of other components. In most embodiments, it may be possible to use feedback from a rejection photodetector to change settings of a TOPS to detune an intra-cavity ring filter.

In many embodiments, it may be possible to minimize linewidth in a tunable laser by detuning an intra-cavity ring filter using a feedback loop so that the lasing frequency may be on a slope of the filter. In some embodiments, when the lasing frequency is on a slope, frequency fluctuations may be converted to amplitude fluctuations when passing through an element with frequency-dependent transmission. In certain embodiments, with the proper choice of slope sign and magnitude, laser noise may be reduced. In some embodiments, amplitude changes can cause frequency changes in a gain chip, which may cancel out the original frequency changes. In most embodiments, it may be possible to stabilize a laser against reflection feedback using detuning. In certain embodiments, it may be possible to use a Vernier ring to select wavelength of a laser. In most embodiments, a Vernier ring may comprise multiple filters used to output a single wavelength, which may be the mutual resonant wavelength of these filters. In some embodiments, two or more Vernier rings may be used to set a wavelength of a laser. In many embodiments, a Vernier ring may have its own free spectral range (FSR) or period. In certain embodiments, it may be possible to detune a laser with two or more Vernier rings.

In some embodiments, a pair of rings may use the Vernier effect to select wavelength of a laser. In many embodiments, each Vernier ring may have rings have different FSR. In some embodiments, only a wavelength selected by each Vernier ring may be able to leave the laser, thus providing a way to select a wavelength. In certain embodiments, for tunable lasers that use Vernier rings as wavelength selective filters in the laser cavity, laser phase noise may be reduced via selection of operation point of the laser cavity filters. In many embodiments, high finesse laser cavity filters such as ring resonators may effectively reduce unwanted fluctuations/noises when the laser mode is on a long wavelength side to the filter transmission peak.

Refer now to the example embodiment of FIG. 1, which illustrates a transmission spectrum of a laser cavity filter (a ring resonator as an example) used to select laser mode. FIG. 1 illustrates a transmission spectrum of typical filters, e.g., ring resonators or Fabry-Perot etalons, used in laser cavities for laser mode selection. In the embodiment of FIG. 1, if the resonance is intentionally detuned, i.e., making the laser lase at the slope rather that the peak of the filter transmission, then laser phase noise can be enhanced, such as at points of fluctuation enhancement 110, or reduced, such points as fluctuation reduction 120, depending on which slope side the lasing mode is.

In FIG. 1, when the laser frequency is on the short wavelength side of the filter, an increase in the carrier density of the gain medium leads to blue shift of the laser frequency, which moves it further away from the filter peak and sees increased optical loss from the filter. In this embodiment, due to the increased optical loss, the optical power is decreased and less carriers are be converted to photons by stimulated optical emissions. In this embodiment, equivalently, the original increase of the carrier density is enhanced through this feedback.

In FIG. 1, for the laser frequency on the long wavelength side of the filter, an increase in the carrier density of the gain medium may lead to blue shift of the laser frequency, which therefore moves closer to the filter peak and sees reduced optical loss from the filter. In this embodiment due to the reduced optical loss, the optical power is increased and more carriers are be converted to photons. In this embodiment, on the long side of the wavelength filter, original increase of the carrier density is alleviated. In this embodiment, laser mode on the long wavelength side is more stable than laser mode on the short wavelength side of the filter.

In most embodiments, Applicants have discovered that detuning a tunable laser may create a more stable laser mode. In many embodiments, Applicants have further realized that detuning may require real time feedback due to changing optical properties resulting from operation of a laser. In most embodiments, a tunable laser may be detuned by using the output of a photodetector monitoring an input signal to cavity filter and the output of a photodetector, called a monitor photodetector, monitoring an input signal from a rejection photodetector to a feedback loop controlling settings of a TOPS co-located with an intra-cavity ring filter. In some embodiments, feedback from a rejection photodetector may be normalized, compared to a target, multiplied by an alpha factor, and then provided by an integrator to a TOPS controller to control a TOPS. In most embodiments, an integrator may be circuitry that provides a cumulative sum of an input. In many embodiments, an integrator in a control loop may use error signal as input. In further embodiments, an integrator may ensure that the error signal is driven to zero.

Figure 2:
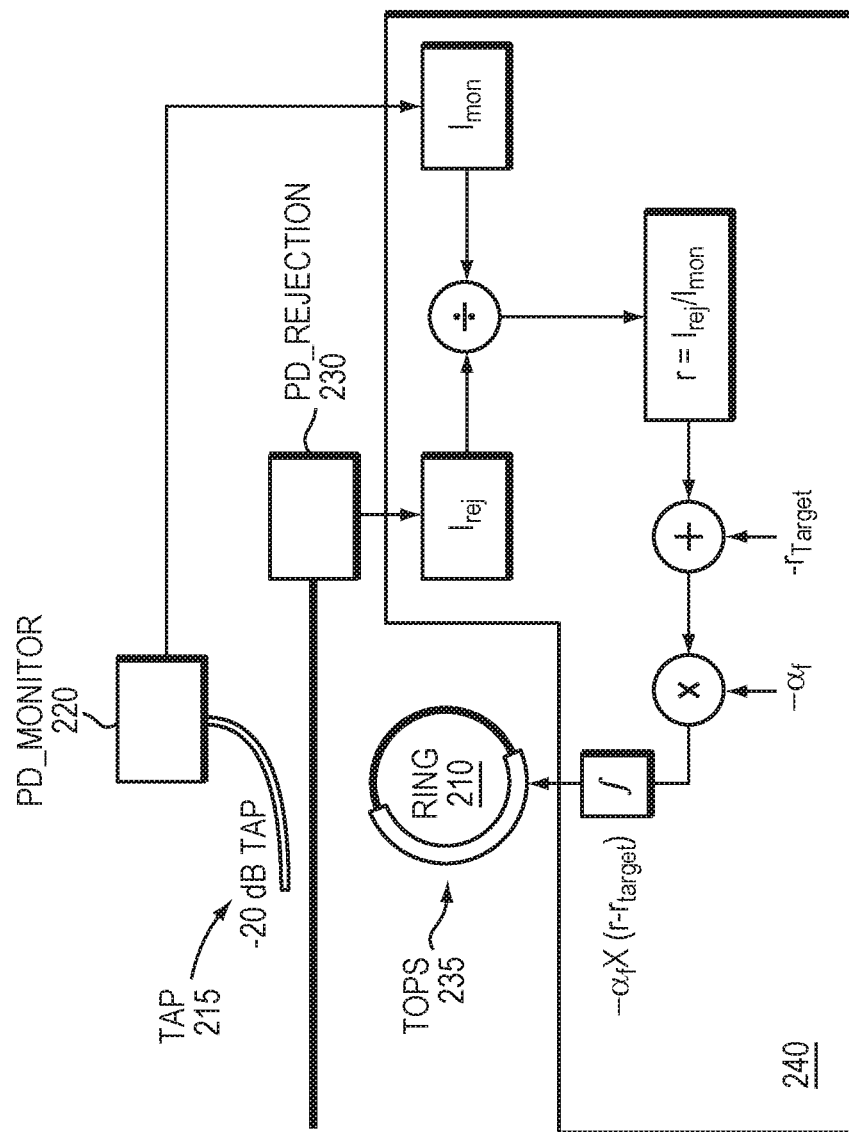
FIG. 2 is a simplified illustration of a ring with a control loop, in accordance with an embodiment of the present disclosure.

Refer now to the example embodiment of FIG. 2, which illustrates an intra-cavity ring filter, photodetectors, a TOPS, and a feedback loop. In the example embodiment of FIG. 1 input from a source to ring 210 is tapped off by tap 215 and sent to photodetector 220. Light rejected from the ring is sent to rejection photodiode 230. Output from photodiode monitor 220 and photodiode monitor 230 are sent to feedback loop 240. Feedback loop 240 controls TOPS 235. Based on feedback loop 240, TOPS 235 can adjust the optical properties of Ring 210 by adjusting the temperature of Ring 210.

In other example embodiments, there may be filtering, integration, differentiation or related electronic functions to enhance the control loop operation. In those embodiments, the control loop may be either done in analog electronics, digitally, or a combination of both. The normalization to the power monitor is optional. In certain further example embodiments, rather than normalize a signal, a control loop may normalize a target. In some example embodiments, other means of obtaining a laser power than using tapped power monitor may be used.

In most embodiments, by controlling the ring phase, i.e., via one or more TOPS on the rings, and reading the photodetector (PD) currents as feedback, a tuning process may be stopped when a rejection PD currents (normalized by a monitor PD current, which indicates the total optical power) is within a target range around a target level. In many embodiments a target level may be a predetermined level that indicates a particular wavelength. In some embodiments, two rings may be used. In certain embodiments, if two or more rings are used the control loop may operate in an iterative way, by reading PD currents and adjusting TOPS s for each ring sequentially. In those embodiments, the control loop may execute iteratively upon each tuning of the wavelength. In further embodiments, the control loop may also execute iteratively on a short time delay (e.g. every 2 seconds) to maintain laser operation under potential environment temperature changes.

In many embodiments, for each two rings an output curve may be along a steep slope on the long wavelength side of a transmission curves, such as shown, for example, in the embodiment of FIG. 1. In certain embodiments, tuning along a slope may provide enhanced noise alleviation to reduce phase noise. In certain embodiments, a feedback loop may normalize a rejection photocurrent from a rejection photodiode with a photocurrent from a monitoring photodiode. In most embodiments, a rejection reading from a rejection photodiode is normalized by dividing by a reading from a monitoring photodiode. In many embodiments, a value of a comparison between from a rejection photodiode to a monitoring photodiode may be compared with a target value to arrive a difference from a target value. In certain embodiments, a difference from a target value may be multiplied by a factor of to arrive at a feedback value. In most embodiments, a feedback value may be sent to a TOPS control to change the value of the TOPS based on the feedback value. In some embodiments, a feedback loop may stop when an absolute value of rPD−rtarget is smaller than the ending condition, e.g., abs(rPD−rtarget)<Δ.

Figure 3A:
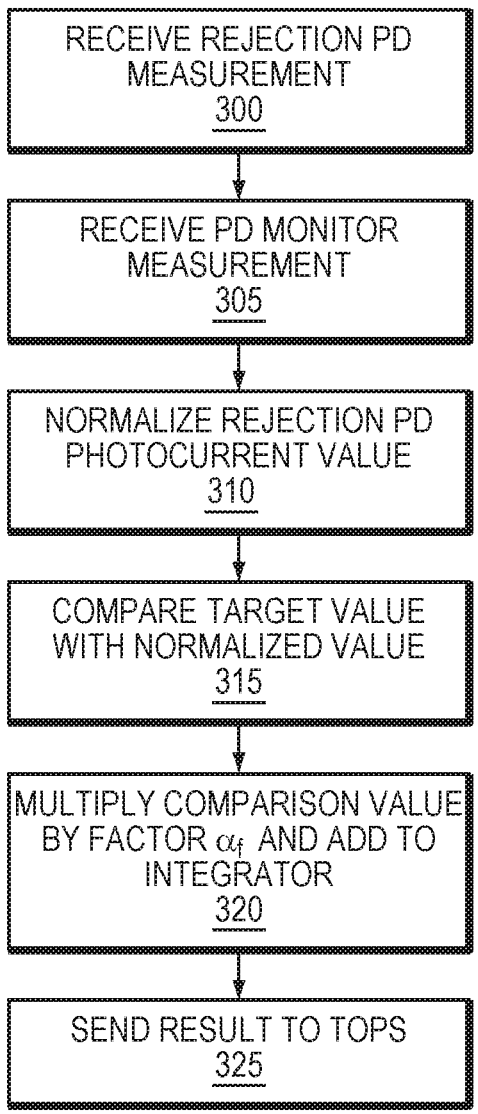
FIG. 3A is a simplified illustration of a method for a control loop which normalizes the result value in its calculations, in accordance with an embodiment of the present disclosure.
Figure 4A:
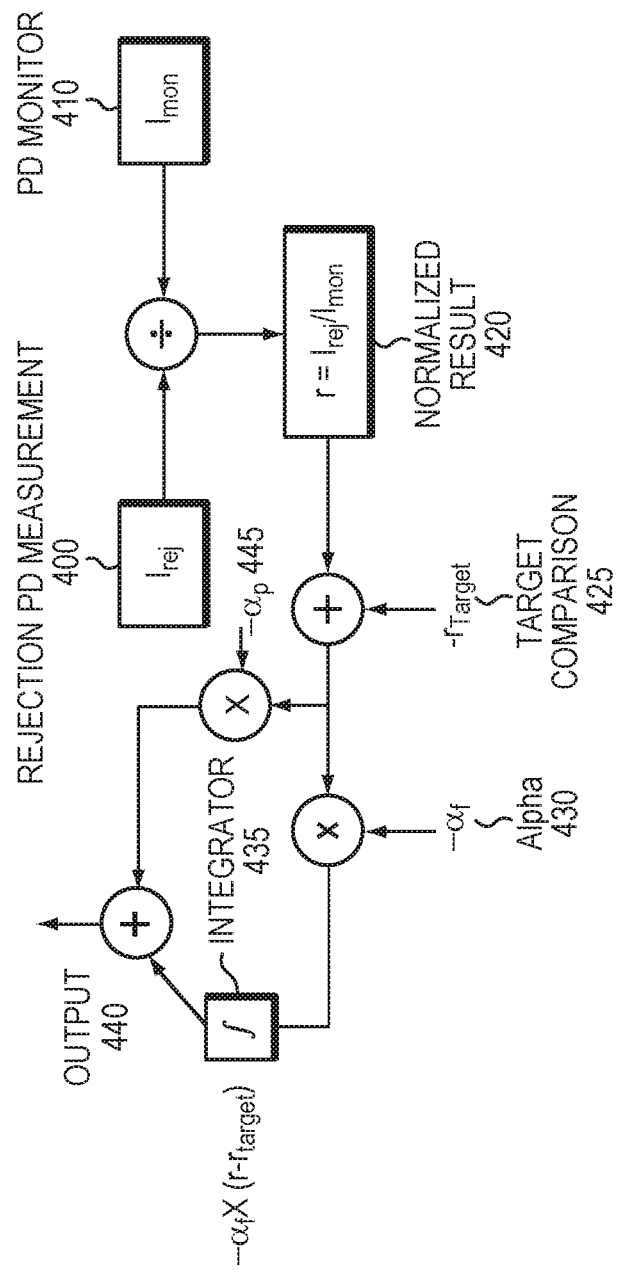
FIG. 4A is a simplified illustration of a control loop that normalizes the result value, in accordance with an embodiment of the present disclosure.

Refer now to the example embodiments of FIGS. 3A and 4A which illustrate a control loop method and a control loop, wherein the rejection photodetector photocurrent value is normalized. Measure of rejection photodiode 400 is received at the control loop (step 300). Measure from monitoring photodetector 410 is received at the control loop (step 305). A normalized result 420 is calculated by dividing the rejection PD measurement 400 by the PD monitor measurement 410 (step 310). Normalized result 420 is added to a negative target comparison number 425 (step 315). The result of the addition is multiplied by Alpha_f 430 (step 320) and is integrated (continuously summed), and the result of the addition is multiplied by Alpha_p 445 and is added to the integrated result.

In other embodiments, a target value may be normalized instead of normalizing a rejection PD photocurrent value. In many embodiments, multiple rings may be used and the multiple rings may use the Vernier effect to select a wavelength. In certain embodiments, laser filter rings may be called Vernier rings.

Figure 3B:
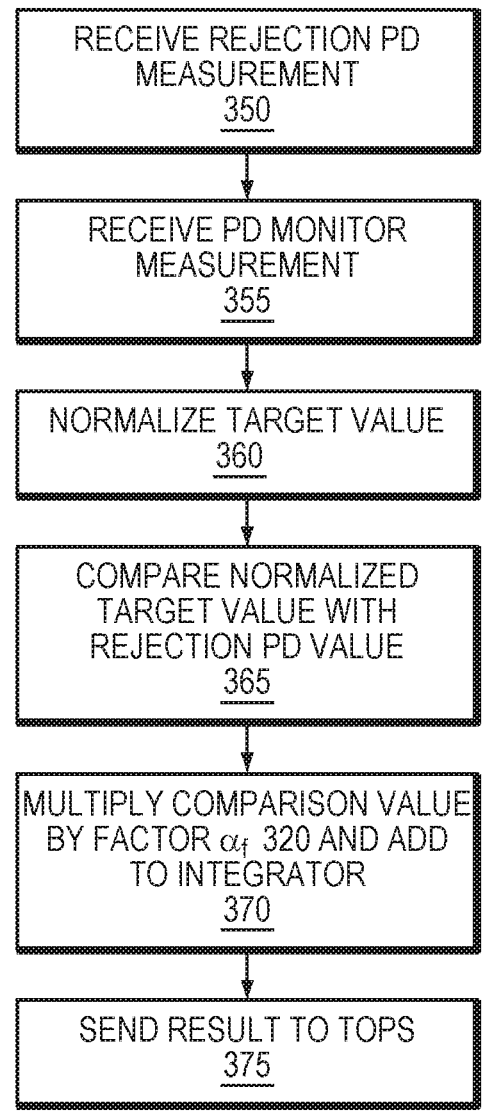
FIG. 3B is a simplified illustration of a method for a control loop which normalizes the target value in its calculations, in accordance with an embodiment of the present disclosure.
Figure 4B:
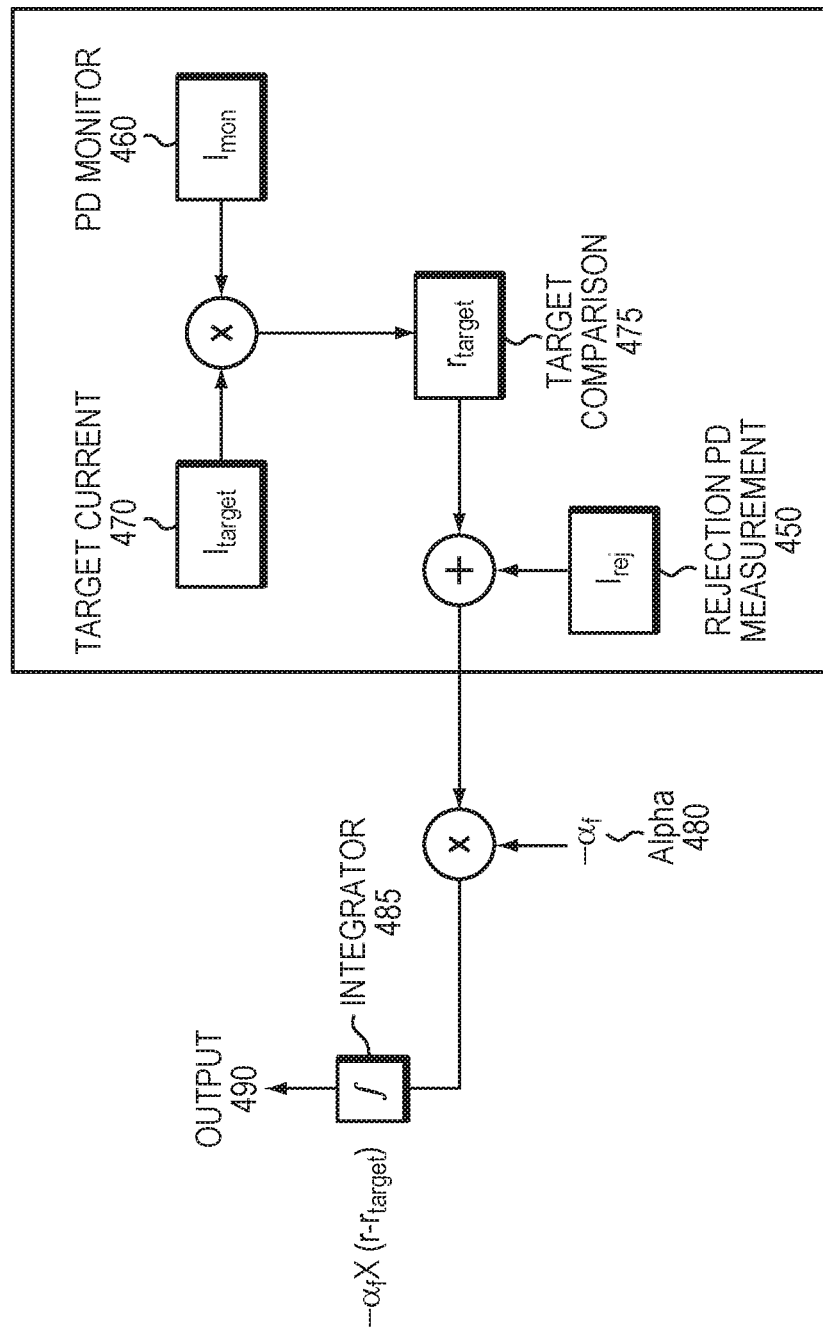
FIG. 4B is a simplified illustration of a control loop that normalizes the target value, in accordance with an embodiment of the present disclosure.

Refer now to the example embodiments of FIGS. 3B and 4B which illustrate a control loop method and a control loop, wherein the rejection photodetector photocurrent value is normalized. Measure of rejection photodiode 450 is received at the control loop (step 350). Measure from monitoring photodetector 460 is received at the control loop (step 355). A normalized target 465 is calculated by multiplying target current value 470 by the PD monitor measurement 460 (step 360). Rejection PD measurement 450 is added to a negative normalized target comparison number 475 (step 365). The result of the addition is multiplied by alpha factor 480 (step 370). The result, as output 480 is provided to TOPS (step 375).

Figure 5:
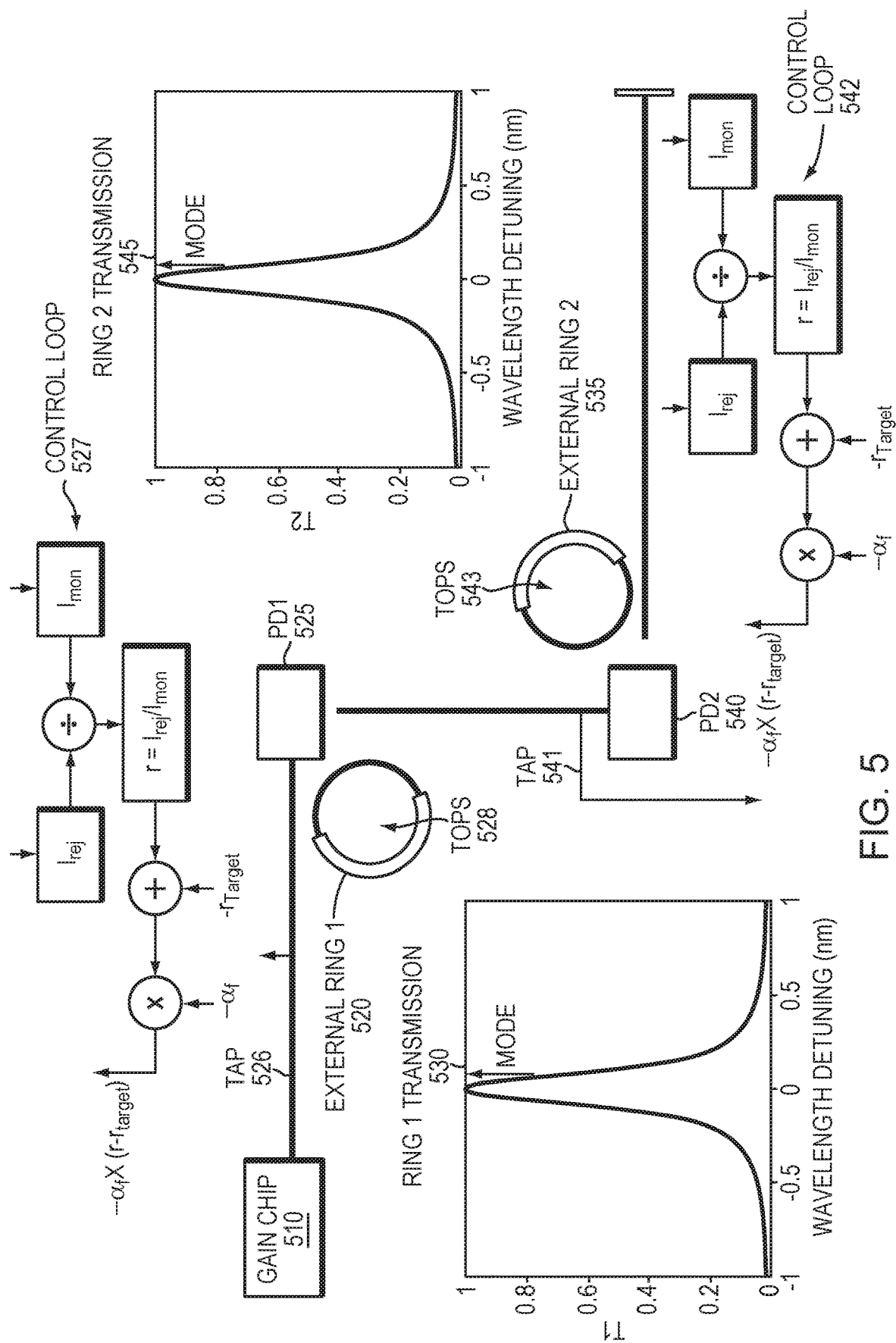
FIG. 5 is a simplified illustration of a tunable laser with two laser loops, in accordance with an embodiment of the present disclosure.

Refer now to the example embodiment of FIG. 5, which illustrates a laser cavity comprising a gain chip and two intra-cavity ring filters. In the example embodiment of FIG. 5 gain chip 510 feeds intra-cavity ring 1 520. Rejection photodiode PD 1 525 is fed off light rejected from intra-cavity ring 1 520. PD 1 525 and tap 526 provide input to control loop 527 that provides feedback to TOPS 528. TOPS 528 is adjusted based on feedback to detune intra-cavity ring 1 520 to match ring 1 transmission graph 530. Output from intra-cavity ring 1 520 feeds intra-cavity ring 2 535. Rejection photodiode PD2 540 is fed off light rejected from intra-cavity ring 2 535. PD2 540 and tap 541 provide input to control loop 542 that provides feedback to TOPS 543. TOPS 543 is adjusted based on feedback to detune intracavity ring 2 535 to match ring 2 transmission graph 545.

In the embodiment of FIG. 5, in order to achieve low phase noise (low linewidth), the tunable laser is operated with the mode on the long wavelength side of the ring transmission spectrum. In this embodiment, instead of targeting at zero PD current level, a raised target level of PD currents is used. As shown in this embodiment, by controlling the ring phase, i.e., via thermos-optic phase shifters (TOPS) on the rings, and reading the PD currents as feedback, the tuning process can when the rejection PD currents (normalized by the monitor PD current, which indicates the total optical power) are within a target range around the target level.

Figure 6:
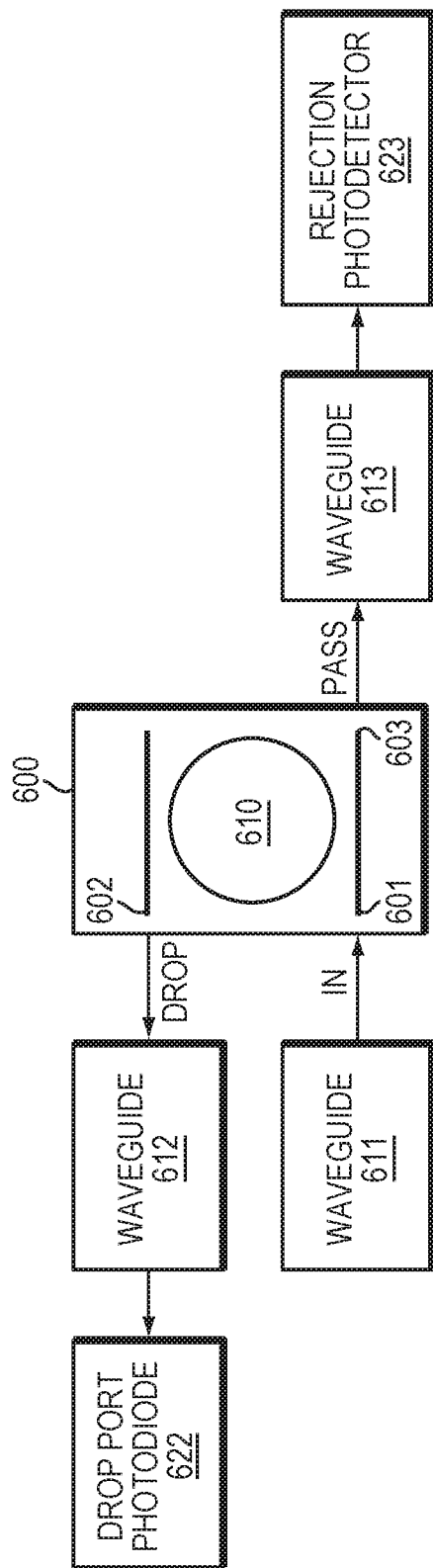
FIG. 6 is a simplified illustration of a laser ring filter with a drop port and a pass port, in accordance with an embodiment of the present disclosure.

Refer now to the example embodiment of FIG. 6. In the embodiment of FIG. 6, intra-cavity ring filter 610 is connected in a drop configuration with drop port 602 and in a pass configuration with pass port 603. Using both of these ports with intra-cavity ring filter 610 allows add-drop filter 600 to pass from waveguide 611 via in port 601, through add-drop filter 600, to waveguide 612 via drop port 602. Waveguide 612 leads to drop port photodiode 622. The combination also allows optical transmission to rejection photodetector 623, via pass port 603. Usage of pass port 603 with drop port 602 allows for intra-cavity ring filter 610 to pass wavelengths past a certain threshold through pass port 603 and drop others through drop port 602.

In other embodiments, Applicants have noted that if the currents for rejection photodiodes where minimized or tuned to 0, cavity loss may be minimized but the phase noise may not be well controlled. In most embodiments, Applicants have also realized that detuning, such as shown in FIGS. 3 and 4, may enable a compact tunable laser, that achieve high optical power (>16 dBm), low electrical power consumption (~2.5 W totally), and low linewidth (<100 kHz). In almost all embodiments, Applicants have also realized that without this type of detuning, laser linewidth (in a frequency band 2-30 MHz) may increase 300 kHz.

In some embodiments, a detuned Vernier ring filter may be used to reduce phase noise of a tunable laser. In certain embodiments, a tunable laser may have a gain chip and an intra-cavity ring filter, which may be used for wavelength tuning and selection for the tunable laser. In most embodiments, each ring of a tunable laser may have its own TOPS to enable an effective refractive index of the ring to be controlled by thermal effects. In some embodiments, resonance states of a ring may be monitored by a rejection photodetector on a waveguide pass port for light uncoupled into the ring. In many embodiments, rejected light from a ring may be set to be a non-zero current level by reading a rejection photodiode's current, comparing it to a target current, and using the difference between the target and the current as a feedback to adjust a TOPS. In certain embodiments, if a tunable laser has more than a single ring, a control loop may iterate through each ring, adjusting a TOPS associated with each ring. In some embodiments, a control loop may stop adjusting a TOPS when a difference between a target value and a rejection value is within a specified range.

In many embodiments, one or more of the current techniques may be performed in a digital signal processor (DSP). In most embodiments, one or more of the current techniques may be performed in real time. In further embodiments, a control loop may be implemented in digital logic. In other embodiments, a control loop may be implemented in analog logic. In some embodiments, a control loop may be embodied in a digital circuit. In other embodiments a control loop may be embodied in a digital circuit.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor. In most embodiments, a processor may be a physical or virtual processor. In other embodiments, a virtual processor may be spread across one or more portions of one or more physical processors.

What is claimed is:

1. An apparatus for adjusting a phase noise of a laser, the apparatus comprising:
    a laser with a waveguide;
    a tap optically connected to the waveguide;
    a photodetector optically connected to the tap;
    a rejection photodetector optically connected to the waveguide;
    circuitry to measure a photocurrent of the rejection photodetector;
    an intracavity ring resonator; and
    a feedback loop that adjusts a refractive index of the intracavity ring resonator such that the photocurrent is held at a non-zero target value.

2. The apparatus of claim 1, further comprising a second intracavity ring resonator wherein the second intracavity ring resonator has a second refractive index.

3. The apparatus of claim 2, wherein:
    the feedback loop further adjusts the refractive index by:
        normalizing a target value;
        determining a difference between an output from the first rejection photodetector and the normalized target value;
        multiplying the difference by an alpha factor; and
        providing the multiplied difference to a thermal-optic phase shifter (TOPS); and
    a second feedback loop adjusts the second refractive index by:
        normalizing a second target value.

4. The apparatus of claim 3, further comprising a second rejection photodetector, and wherein the second feedback loop further adjusts the second refractive index by:
    determining a second difference between an output from the second rejection photodetector and the normalized second target value;
    multiplying the second difference by a second alpha factor; and
    providing the multiplied second difference to the TOPS.

5. The apparatus of claim 2, further comprising:
    a second rejection photodetector;
    circuitry to measure a photocurrent of the second rejection photodetector; and
    a second feedback loop that adjusts the second refractive index of at least a part of the second intracavity ring resonator such that a photocurrent of the second intracavity ring resonator is held at a non-zero value.

6. The apparatus of claim 2 further comprising:
a second waveguide;
a second rejection photodetector optically connected to the second waveguide;
circuitry to measure a photocurrent of the second rejection photodetector; and
a second feedback loop that adjusts the second refractive index to hold a second photocurrent at a second target value.

7. The apparatus of claim 6, wherein:
the feedback loop adjusts the refractive index by:
  normalizing an output from the rejection photodetector;
  determining a difference between the normalized output and a target value;
  multiplying the difference by an alpha factor; and
  providing the multiplied difference to a thermal-optic phase shifter (TOPS); and
the second feedback loop adjusts the second refractive index by:
  normalizing the second target value;
  determining a second difference between an output from the second rejection photodetector and the normalized second target value;
  multiplying the second difference by a second alpha factor; and
  providing the multiplied second difference to the TOPS.

8. The apparatus of claim 7, further comprising:
a third intracavity ring resonator with a third waveguide, wherein:
  the third intracavity ring resonator has a third rejection photodetector optically connected to the third waveguide; wherein the third intracavity ring resonator has a third refractive index;
  circuitry to measure a photocurrent of the third rejection photodetector; and
  a third feedback loop that adjusts the third refractive index to hold a third photocurrent at a third target value.

9. The apparatus of claim 6, wherein:
the feedback loop adjusts the refractive index by:
  normalizing an output from the rejection photodetector;
  determining a difference between the normalized output and a target value;
  multiplying the difference by an alpha factor; and
  providing the multiplied difference to a thermal-optic phase shifter (TOPS); and
the second feedback loop adjusts the second refractive index by:
  normalizing an output from the second rejection photodetector;
  determining a second difference between the normalized output from the second rejection photodetector and the second target value;
  multiplying the second difference by a second alpha factor; and
  providing the multiplied second difference to a second thermal-optic phase shifter (TOPS).

10. The apparatus of claim 6, wherein:
the feedback loop adjusts the refractive index by:
  normalizing a target value;
  determining a difference between an output from the rejection photodetector and the normalized target value;
  multiplying the difference by an alpha factor; and
  providing the multiplied difference to a thermal-optic phase shifter (TOPS); and
the second feedback loop adjusts the second refractive index by:
  normalizing the second target value;
  determining a second difference between an output from the second rejection photodetector and the normalized second target value;
  multiplying the second difference by a second alpha factor; and
  providing the multiplied second difference to a second thermal-optic phase shifter (TOPS).

11. The apparatus of claim 6, wherein:
the feedback loop adjusts the refractive index by:
  normalizing an output from the rejection photodetector;
  determining a difference between the normalized output and a target value;
  multiplying the difference by an alpha factor; and
  providing the multiplied difference to a thermal-optic phase shifter (TOPS); and
the second feedback loop adjusts the second refractive index by:
  normalizing the second target value;
  determining a second difference between an output from the second rejection photodetector and the normalized second target value;
  multiplying the second difference by a second alpha factor; and
  providing the multiplied second difference to a second thermal-optic phase shifter (TOPS).

* * * * *